United States Patent [19]

Staebler et al.

[11] 4,217,393
[45] Aug. 12, 1980

[54] METHOD OF INDUCING DIFFERENTIAL ETCH RATES IN GLOW DISCHARGE PRODUCED AMORPHOUS SILICON

[75] Inventors: David L. Staebler; Peter J. Zanzucchi, both of Lawrenceville, N.J.

[73] Assignee: RCA Corporation, New York, N.Y.

[21] Appl. No.: 927,627

[22] Filed: Jul. 24, 1978

[51] Int. Cl.² ............... H01L 21/306; B44C 1/22; C03C 15/00; C03C 25/06
[52] U.S. Cl. .................. 428/450; 156/628; 156/643; 156/657; 427/39; 427/86
[58] Field of Search ............. 156/609, 628, 643, 657, 156/662; 148/1.5, 187; 427/39, 43, 86, 93, 95, 372; 96/36.2, 38.3, 38.4; 204/192 EC, 192 E, 164; 428/446, 450; 252/79.5

[56] References Cited

U.S. PATENT DOCUMENTS

| | | | |
|---|---|---|---|
| 2,989,385 | 6/1961 | Gianola et al. | 156/643 |
| 3,698,947 | 10/1972 | Kemlage et al. | 148/174 X |
| 3,721,584 | 3/1973 | Diem | 427/167 UX |
| 3,873,203 | 3/1975 | Stevenson | 96/38.3 X |
| 3,873,341 | 3/1975 | Janus | 156/643 X |
| 4,059,461 | 11/1977 | Fan et al. | 148/1.5 |
| 4,064,521 | 12/1977 | Carlson | 427/39 X |
| 4,092,209 | 5/1978 | Ipri | 156/628 |

OTHER PUBLICATIONS

Applied Physics Letters, vol. 30, No. 11, Jun. 1977, Quantitative Analysis of Hydrogen In Glow Discharge Amorphous Silicon, pp. 561–563.
Applied Physics Letter, 32(4), Feb. 15, 1978, Chemical Vapor Deposition of Silicon Using A $CO_2$ Laser, pp. 254–255.
IEEE Transactions On Electronic Devices, vol. ED-21, No. 11, Nov. 1974 p. 743.

Primary Examiner—William A. Powell
Attorney, Agent, or Firm—Birgit E. Morris; A. Stephen Zavell

[57] ABSTRACT

A method of inducing differential etch rates in glow discharge produced amorphous silicon by heating a portion of the glow discharge produced amorphous silicon to a temperature of about 365° C. higher than the deposition temperature prior to etching. The etch rate of the exposed amorphous silicon is less than the unheated amorphous silicon.

15 Claims, 1 Drawing Figure

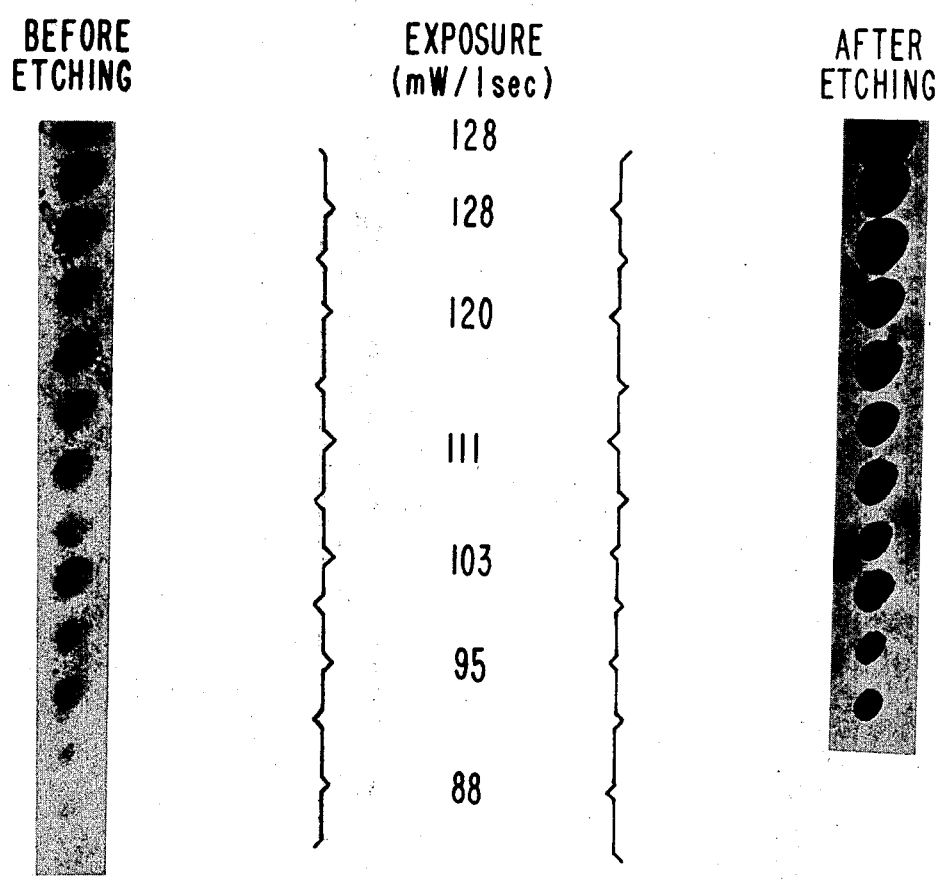

METHOD OF INDUCING DIFFERENTIAL ETCH RATES IN GLOW DISCHARGE PRODUCED AMORPHOUS SILICON

The invention described herein was made in the performance of work under an Energy Research and Development Administration Contract, (ERDA) presently the Department of Energy, No. EY-76-C-03-1268.

BACKGROUND OF THE INVENTION

This invention relates to inorganic resist materials. More particularly, this invention relates to an inorganic resist material which exhibits a differential etch rate when exposed to a heat source.

A resist is a material which changes its solubility in a particular solvent after exposure to a source of energy such as heat, light or electron beams for example. A layer of a resist is applied to a substrate, exposed partially to an energy source and developed by immersion in an etchant. The difference in etch rates for the exposed versus unexposed portions of the film results in partial dissolution of the resist film to expose portions of the substrate beneath. The substrate not covered by the resist can then be etched away, and the resist removed, resulting in a surface relief pattern in the substrate.

Generally, resist materials are used in the electronics industry to define surface relief patterns in semiconductor materials. With the increasing complexity of integrated circuits and integrated circuit technology, there is a great need for a resist material which does not swell upon development and thus limit the resolution and definition of lines or circuit elements. Development refers to the process of removing the exposed portion of a positive resist material or the unexposed portion of a negative resist after exposure to light. The chemicals used for the removal of the resist tend to swell the remaining material.

Photoresist materials are generally sensitive to light of specific wavelengths and require a particular light source which emits light at the wavelength sensitivity of the resist. Electron beam resists, although providing superior sensitivity than most light sensitive resists, are complex and require more expensive and complicated machinery to be used effectively.

Polycrystalline silicon, silicon nitride, and silicon dioxide have been used as masking layers in the processing of silicon on sapphire devices. Patterns in said materials have been formed by standard photolithographic techniques, for example, see U.S. Pat. Nos. 3,698,947 and 3,721,584. Recently, Laff et al in IEEE Transactions On Electron Devices, Vol. ED-21, No. 11, November, 1974, p. 743, reported that heating a CVD deposited silicon film with a Gaussian-focussed continuous wave argon-ion laser to about 1000° C. at a scan of about 10 centimeters per second rendered the heated portion of the film selectively etch resistant as compared with the surrounding silicon material. The Laff et al technique, although potentially useful for upgrading large areas of silicon for solar cells, is not suitable for complex microelectronic structures where even localized heating to 1000° C. can affect doping levels and interdiffusion of dopants into the device structure.

Thus, it would be highly desirable to find an inorganic resist material which does not swell upon development, is low in cost, and etches at a different rate upon exposure to low level heat than the unheated material.

SUMMARY OF THE INVENTION

We have found that amorphous silicon films which are soluble in strongly basic solution can be made less soluble by exposure to a low level heat source, and thus can be used as a resist.

The present method comprises exposing a glow discharge produced amorphous silicon resist film to a heat source capable of heating a portion of the film to a temperature about 365° C. greater than the deposition temperature of the film, and immersing the film in a strongly basic etching solution, which etches the heated portion of the film at a lower rate than the unheated portion of the film.

BRIEF DESCRIPTION OF THE DRAWING

The FIGURE illustrates the induced differential etching of an amorphous silicon film exposed to an argon laser heat source before etching, left photograph, and after etching, right photograph. The remaining material formed a surface relief pattern on the substrate.

DETAILED DESCRIPTION OF THE INVENTION

An amorphous silicon film is deposited, according to the teachings of Carlson in U.S. Pat. No. 4,064,521, incorporated herein by reference, on a substrate. More specifically, the films can be produced with a direct current (D.C.) discharge in $SiH_4$ using the substrate as the cathode. The discharge is not limited to D.C. discharge. Other discharges known to the skilled artisan, such as alternating current discharge or radio frequency discharge, operative at room temperature, can be used to deposit the amorphous silicon films. In contrast to standard resist materials, the films can be doped with n-type and p-type conductivity modifiers such as $B_2H_6$, $PH_3$ or other dopants known in the art. The doped material can be used to define conducting circuit elements. Optionally, the glow discharge atmosphere can incorporate other silicon containing compounds such as $SiH_2Cl_2$, $SiHCl_3$, $SiCl_4$, $SiH_3Br$, $SiH_2Br_2$, and the like.

The substrate may be any suitable material such as glass, sapphire, polycrystalline or single crystalline silicon, indium tin oxide on glass, metals such as stainless steel, molybdenum and the like.

The teachings of Carlson are modified in that the substrate temperature should be about room temperature, i.e., about 25° C. during deposition of the amorphous silicon film. The differential etch rate between the heated and unheated amorphous silicon is less pronounced as the substrate temperature, during the deposition of the amorphous silicon, is increased above 25° C. We believe the lesser etch rate may be related to the known decrease in hydrogen content as the deposition temperature increases.

The amorphous silicon film is rendered less etchable in basic etching solutions upon heating to a temperature of about 365° C. above the deposition temperature of the film. Although any heat source which is capable of heating the film above 365° C. is acceptable, a heat source which can be sharply focussed to define lines or circuit elements, such as an electron beam, an argon or $CO_2$ laser and the like, is preferred. The circuit element size or line width is limited only to the technology of focussing a heat source on the amorphous film. Argon lasers can be focussed to about 1 micron, or 1000 nanometers, and electron beams can define patterns less than about 100 nanometers in width. In addition, polycrystalline gates for MOS devices and the like can be formed by further heating an undoped amorphous silicon film after etching to at least about 600° C. Although not fully understood, we believe the change in the etch rate is caused by the evolution of hydrogen gas from the amorphous silicon film as taught by Brodsky et al in Appl. Phys. Lett., Vol. 30, No. 11, pp. 561–563 (1977). After exposure to a heat source, the amorphous silicon is exposed to a basic etchant known in the art having a pH greater than about 10, such as a buffered solution of sodium hydroxide, a buffered solution of potassium hydroxide and other strongly basic, pH >10, commercial solutions such as one part Decontam, a product of the Kern Chemical Company, to four parts water.

The amorphous film is immersed in the etchant solution for a sufficient time to etch the unexposed portion of the amorphous silicon. An immersion time of fifteen minutes to about two hours is generally sufficient to etch the unexposed portions of the film. Optionally, the solution can be ultrasonically agitated to speed the etching process.

Single crystal silicon wafers and silicon on sapphire wafers exposed to the same etchant solutions exhibit no etching after periods of up to four hours and therefore, the amorphous silicon film is useful when device design requires a resist material which can be removed without affecting the silicon or sapphire wafer. Doped and undoped amorphous silicon films exhibit similar differential etching rates, although boron doped and undoped samples appear to etch at a slower rate than phosphorous doped amorphous silicon. On the other hand, phosphorous doped amorphous silicon films, for reasons not entirely clear, require heating to higher temperatures to induce differential etching than are required by undoped and boron doped amorphous silicon.

The invention will be more clearly illustrated by referring to the following examples, although it is to be understood that we do not intend to limit out invention solely to the examples described herein but rather include those modifications which would be obvious to those of ordinary skill in the art.

EXAMPLES 1–6

Examples 1–6 are illustrated in the FIGURE. The color of all of the darkened spots of like exposure was the same. However, due to different camera exposures, the unetched films appear to be lighter in color than the etched films.

A 2000 angstroms thick amorphous silicon film was deposited on a transparent layer of conducting indium tin oxide on a float glass substrate using a DC cathodic discharge in a silane atmosphere with about 1% phosphine ($PH_3$) as an n-type dopant. The substrate was connected to the negative terminal of the power source and therefore functioned as the cathode during the deposition of the amorphous silicon film. The substrate temperature was maintained at about 25° C. during the deposition of the film.

The deposited film was exposed to an argon laser beam focussed to a spot about 90 microns in diameter with a power varying from about 88 milliwatts (mW) to about 128 mW and a constant exposure time of about 1 second. The exposed portion of the film darkens in color with respect to the unexposed film. Thereafter the amorphous silicon film was immersed in an etching solution comprising a pH 11 solution of 1 part Decontam, a strongly basic solution of the Kern Chemical Company, to 4 parts water for about 120 minutes. After etching away the unexposed amorphous silicon, the films heated with 95 mW or power or greater are clearly defined. A power output of about 95 mW corresponds to heating the film to about 390° C., or about 365° C. above the deposition temperature of amorphous films. The film heated by the 88 mW beam, corresponding to a temperature of about 360° C. or about 335° C. above the deposition temperature, was etched away during the etching operations.

We claim:
1. A method of forming a surface relief pattern in amorphous silicon comprising:
   (a) exposing a portion of an amorphous silicon film, fabricated on a substrate by a glow discharge, to a heat source capable of heating said portion of amorphous silicon to a temperature of about 365° C. above the deposition temperature of said portion of amorphous silicon but less than the temperature at which said heat source introduces crystallinity into said heated amorphous silicon; and
   (b) etching away the unexposed amorphous silicon of step (a).
2. The method according to claim 1 wherein the deposition temperature is about 25° C.
3. The method according to claim 1 wherein the heat source is a laser.
4. The method according to claim 3 wherein said laser is an argon laser.
5. The method according to claim 1 wherein the heat source is an electron beam.
6. The method according to claim 1 wherein the amorphous silicon film is doped with p-type conductivity modifiers.
7. The method according to claim 6 wherein the dopant is boron.
8. The method according to claim 1 wherein the amorphous silicon film is doped with n-type conductivity modifiers.
9. The method according to claim 8 wherein the n-type conductivity modifier is phosphorous.
10. The method according to claim 1 wherein the amorphous silicon is fabricated by a glow discharge in silane.
11. The method according to claim 1 wherein the amorphous silicon is fabricated by a glow discharge in a gas atmosphere containing a silicon compound selected from the group consisting of $SiHCl_3$, $SiH_2Cl_2$, $SiH_3Cl$, $SiCl_4$, $SiH_3Br$, and $SiH_2Br_2$.
12. The method according to claim 1 wherein the substrate is selected from the group consisting of glass, sapphire, polycrystalline silicon, single crystalline silicon, indium tin oxide on glass, stainless steel and molybdenum.
13. The method according to claim 1 wherein the etchant is solution has a pH greater than about pH 10.
14. The method according to claim 13 wherein the etchant solution is selected from the group consisting of a buffered solution of sodium hydroxide, and a buffered solution of potassium hydroxide.
15. An etch resistant amorphous silicon film fabricated in accordance with the method of claim 1.

* * * * *

UNITED STATES PATENT AND TRADEMARK OFFICE
CERTIFICATE OF CORRECTION

PATENT NO. : 4,217,393

DATED : August 12, 1980

INVENTOR(S) : David Lloyd Staebler et al.

It is certified that error appears in the above-identified patent and that said Letters Patent is hereby corrected as shown below:

Column 1, line 55: After "scan" insert --rate--.

Column 3, line 38: Change "out" to --our--.

Column 4, line 5 : Change "or" first occurrence to -- of--.

Claim 13, line 2 : Remove "is".

Signed and Sealed this

Tenth Day of February 1981

[SEAL]

Attest:

RENE D. TEGTMEYER

Attesting Officer

Acting Commissioner of Patents and Trademarks